(12) United States Patent
Lee et al.

(10) Patent No.: US 6,646,586 B1
(45) Date of Patent: Nov. 11, 2003

(54) DUAL-SLOPE ANALOG-TO-DIGITAL CONVERTER AND COMPARISON CIRCUIT

(75) Inventors: Yung-Ping Lee, Junghe (TW); Wen-Cheng Yen, Taichung (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/231,083

(22) Filed: Aug. 30, 2002

(51) Int. Cl.[7] ................................................. H03M 1/50
(52) U.S. Cl. ........................................ 341/167; 341/128
(58) Field of Search ................................ 341/127, 128, 341/166, 167, 168

(56) References Cited

U.S. PATENT DOCUMENTS

| | | | | |
|---|---|---|---|---|
| 4,254,406 A | * | 3/1981 | Meares | 341/128 |
| 4,633,223 A | * | 12/1986 | Senderowicz | 341/127 |
| 5,229,772 A | * | 7/1993 | Hanlon | 341/167 |
| 5,373,292 A | * | 12/1994 | Yasuda | 341/166 |
| 5,592,168 A | * | 1/1997 | Liao | 341/167 |

* cited by examiner

*Primary Examiner*—Howard L. Williams
(74) *Attorney, Agent, or Firm*—Rabin & Berdo, P.C.

(57) ABSTRACT

A dual-slope analog-to-digital converter and a comparison circuit for the dual-slope analog-to-digital converter. The dual-slope analog-to-digital converter includes a buffer, an integrator coupled to the buffer and the comparison circuit. The comparison circuit includes a differential output comparator and a comparison unit. The differential output comparator is coupled to the integrator and produces a pair of differential signals to output. The comparison unit receives the differential signals and chooses a signal, whose voltage is from a first level to a second level, from the differential signals to produce an output signal.

11 Claims, 5 Drawing Sheets

DUAL-SLOPE ANALOG-TO-DIGITAL CONVERTER AND COMPARISON CIRCUIT

BACKGROUND OF THE INVENTION

1. Field of the Invention

The present invention relates in general to a dual-slope analog-to-digital converter and a comparison circuit. In particular, the present invention relates to a dual-slope analog-to-digital converter with a comparison circuit for reduction of rollover error due to various input signals in various conditions influenced by different procedures and environments.

2. Description of the Related Art

Figure 1:
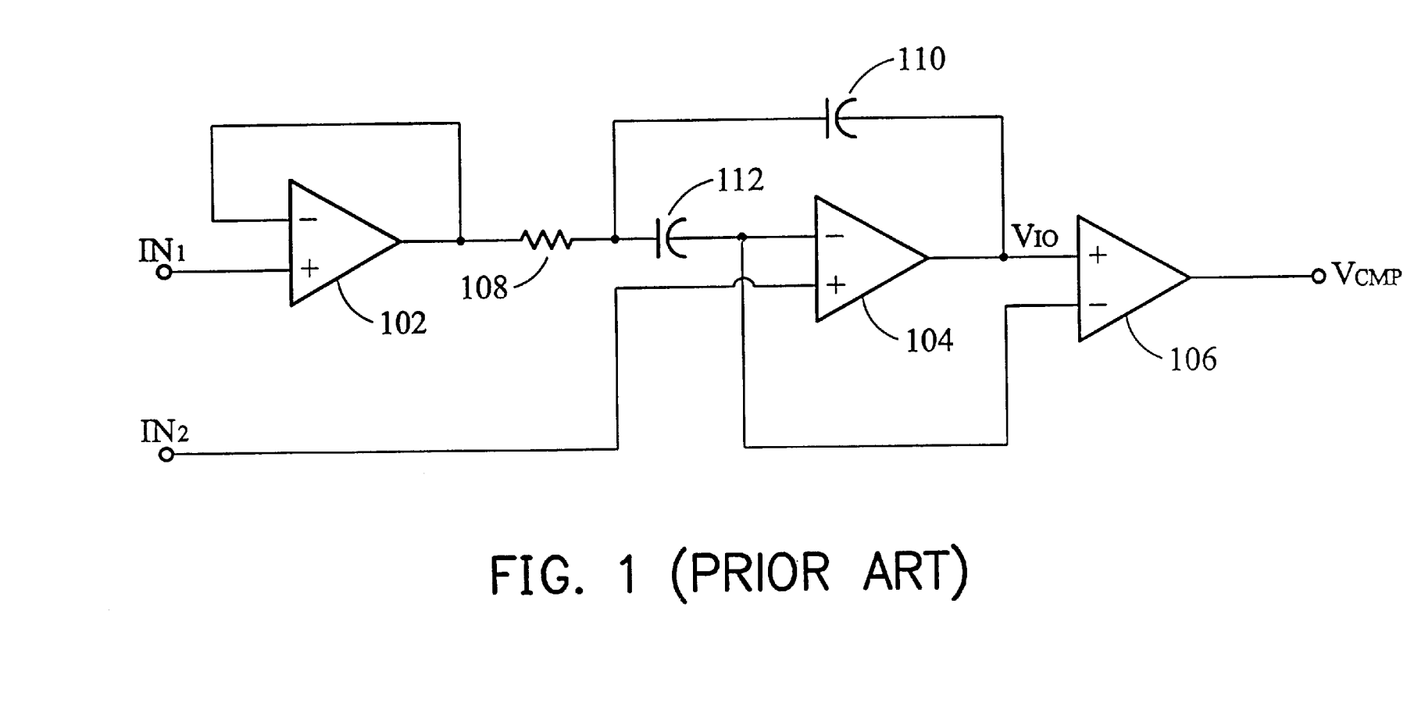
FIG. 1 shows a block diagram of a conventional dual-slope ADC.

FIG. 1 shows a block diagram of a conventional dual-slope ADC. In FIG. 1, the dual-slope ADC comprises a buffer 102, an integrator 104, a comparator 106, a resistance 108, and capacitances 110 and 112. The integrator 104, resistance 108, and capacitances 110 compose an integration circuit. An integration voltage $V_{INT}$ (not shown in FIG. 1) is input into the dual-slope ADC through input terminals $IN_1$, and $IN_2$. The integration voltage $V_{INT}$ passes through the buffer 102 to the integrator 104 for a fixed amount of time to store charge in the capacitor 110. The dual-slope ADC is fed with an opposite polarity voltage $V_{DINT}$ to effect de-integration. When the output voltage $V_{IO}$ of the integrator 104 returns to the initial point, called zero crossing, the comparator 106 changes its state and stops de-integration. The output voltage of the comparator 106 in FIG. 1 is $V_{CMP}$. If the integration time is $T_{INT}$, the de-integration time $T_{DINT}$ is related to the $T_{INT}$ as follows:

$$|V_{INT}| \times T_{INT} = |V_{DINT}| \times T_{DINT} \qquad (1)$$

Conventional dual-slope ADC has single output of the comparator 106. In the following, two situations are considered. In one, the integration voltage $V_{INT}$ input into the dual-slope ADC is positive. In the other, the integration voltage $V_{INT}$ input into the dual-slope ADC is negative.

Figure 2A:
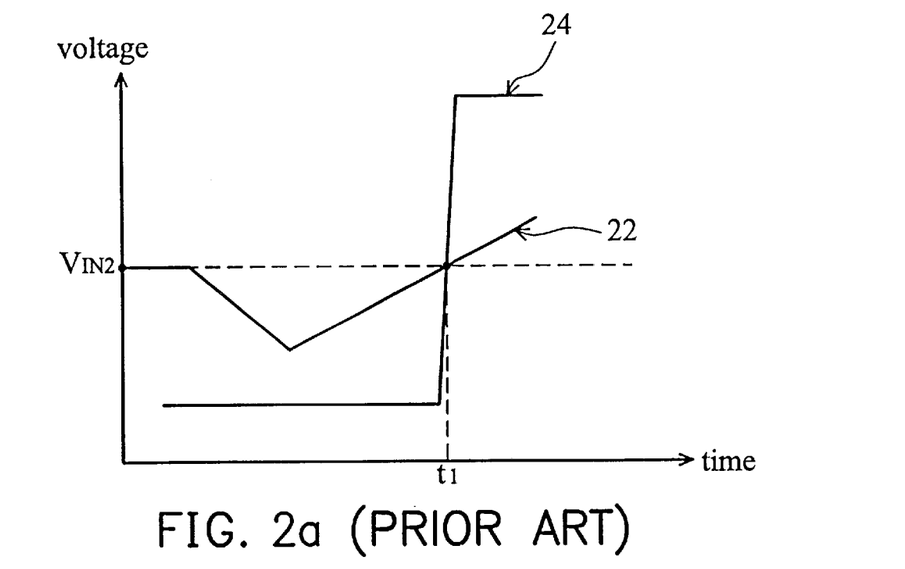
FIG. 2a shows the relation between the output voltage of the integrator and the output voltage of the compactor when the input voltage is positive.

FIG. 2a shows the relation between the output voltage of the integrator $V_{IO}$ and the output voltage of the compactor $V_{CMP}$ when the input voltage is positive. In FIG. 2a, line 22 shows the relation between the output voltage of the integrator $V_{IO}$ and time. Line 24 shows the relation between the output voltage of the compactor $V_{CMP}$ and time. A voltage $V_{IN2}$ in the input terminal $IN_2$ is an initial voltage, i.e. the output voltage $V_{IO}$ equaling the voltage $V_{IN2}$ is called zero crossing. When the positive integration voltage $V_{INT}$ input into the dual-slope ADC, i.e. the voltage input to the input terminal $IN_1$ is higher than the voltage input to the input terminal $IN_2$, while the output voltage $V_{IO}$ is equal to the voltage $V_{IN2}$ (referring to t1 in FIG. 2a), the output voltage of the integrator $V_{IO}$ changes from a negative (low) voltage to a positive (high) voltage and the output voltage of the compactor $V_{CMP}$ is also from a negative (low) voltage to a positive (high) voltage. Thus, a P-channel metal oxide semiconductor (PMOS) in the output stage of the comparator changes from "OFF" to "ON" status and a N-channel metal oxide semiconductor (NMOS) in the output stage of the comparator changes from "ON" to "OFF" status.

Figure 2B:
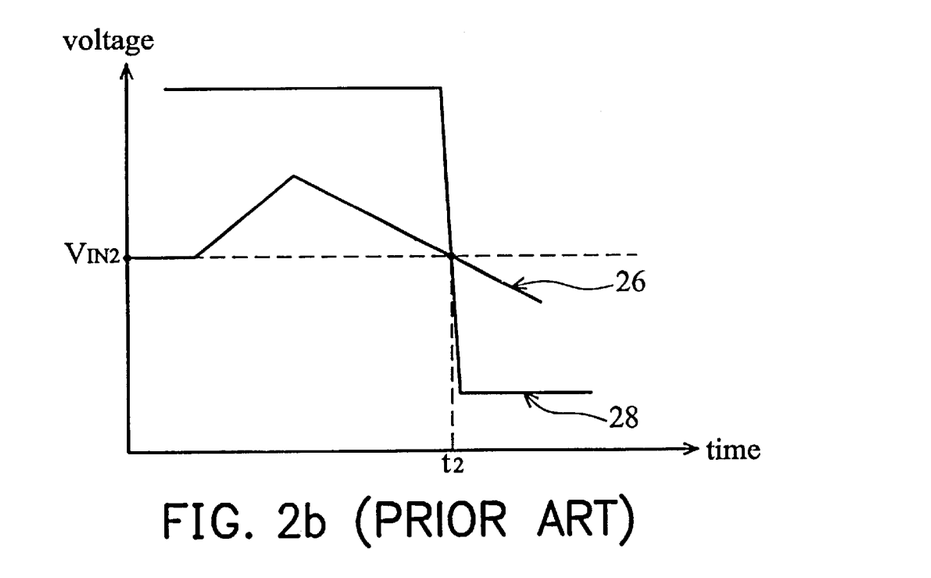
FIG. 2b shows the relation between the output voltage of the integrator and the output voltage of the compactor when the input voltage is negative.

FIG. 2b shows the relation between the output voltage of the integrator $V_{IO}$ and the output voltage of the compactor $V_{CMP}$ when the input voltage is negative. In FIG. 2b, line 26 shows the relation between the output voltage of the integrator $V_{IO}$ and time. Line 28 shows the relation between the output voltage of the compactor $V_{CMP}$ and time. A voltage $V_{IN2}$ in the input terminal $IN_2$ is an initial voltage, i.e. the output voltage $V_{IO}$ equaling the voltage $V_{IN2}$ is called zero crossing. When the negative integration voltage $V_{INT}$ input into the dual-slope ADC, i.e. the voltage input to the input terminal $IN_1$, is lower than the voltage input to the input terminal $IN_2$, while the output voltage $V_{IO}$ is equal to the voltage $V_{IN2}$ (referring to t2 in FIG. 2b), the output voltage of the integrator $V_{IO}$ changes from a positive (high) voltage to a negative (low) voltage and the output voltage of the compactor $V_{CMP}$ is also from a positive (high) voltage to a negative (low) voltage. Thus, a P-channel metal oxide semiconductor (PMOS) in the output stage of the comparator changes from "ON" to "OFF" status and a N-channel metal oxide semiconductor (NMOS) in the output stage of the comparator changes from "OFF" to "ON" status.

The measured result of the dual-slope ADC is influenced by the time of the change of the output voltage of the compactor $V_{CMP}$. The time of the change of the output voltage of the compactor $V_{CMP}$ is influenced by the delay of the comparator. In some applications with higher conversion rate, a slight delay may result in measured result errors. In the prior art, zero calibration is provided to resolve the above problem. However, in the above two situations, the delay of the comparator is different. In the situation shown in FIG. 2a, the state of the comparator is changed by PMOS. In the situation shown in FIG. 2b, the state of the comparator is changed by NMOS. Thus, the different delay cannot be compensated for by the zero calibration. The different delay also increases rollover errors in the dual-slope ADC, i.e. when two voltages with the same value but opposite polarity are input, measured result errors may increase. Furthermore, rollover errors may increase with different procedures and environments.

SUMMARY OF THE INVENTION

An object of the present invention is to provide a dual-slope analog-to-digital converter and a comparison circuit for the dual-slope analog-to-digital converter to reduce rollover errors due to various input signals in various conditions influenced by different procedures and environments.

In the invention, the dual-slope analog-to-digital converter comprises a buffer, an integrator coupled to the buffer, and a comparison circuit. The comparison circuit comprises a differential output comparator and a comparison unit. The differential output comparator is coupled to the integrator and produces a pair of differential signals to output. The comparison unit receives the differential signals and chooses a signal, whose voltage is from a first level to a second level, from the differential signals to produce an output signal.

Furthermore, the invention provides a kind of comparison circuit for the dual-slope analog-to-digital converter. The dual-slope analog-to-digital converter comprises a buffer and an integrator coupled to the buffer. The comparison circuit comprises a differential output comparator and a pair of single output comparators. The differential output comparator is coupled to the integrator and produces a pair of differential signals to output. Each of the single output comparators receives one of the differential signals to choose a signal whose voltage is from a first level to a second level from the differential signal. An output signal is produced by the single output comparator that receives the signal whose voltage changes from the first level to the second level.

The invention also provides another kind of comparison circuit for a dual-slope analog-to-digital converter. The dual-slope analog-to-digital converter comprises a buffer and an integrator coupled to the buffer. The comparison circuit comprises a differential output comparator, a multiplexer and a single output comparators. The differential output comparator is coupled to the integrator and produces a pair of differential signals to output. The multiplexer receives the differential signals and chooses a signal whose voltage is from a first level to a second level from the differential signals. The single output comparator receives the signal whose voltage changes from the first level to the second level to produce an output signal.

BRIEF DESCRIPTION OF THE DRAWINGS

The present invention can be more fully understood by reading the subsequent detailed description in conjunction with the examples and references made to the accompanying drawings, wherein:

FIG. 4 shows a block diagram of an example of the comparison circuit according to the embodiment shown in FIG. 3a; and FIG. 5 shows a block diagram of another example of the comparison circuit according to the embodiment shown in FIG. 3a.

DETAILED DESCRIPTION OF THE INVENTION

Figure 3A:
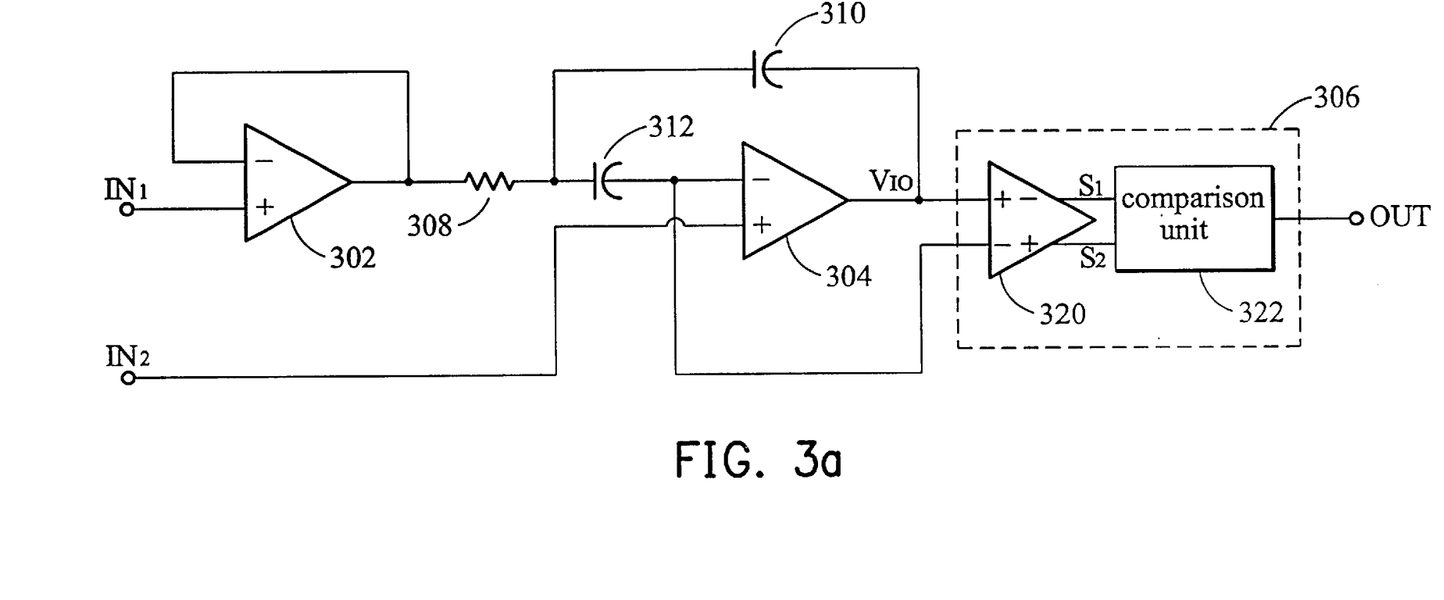
FIG. 3a shows a block diagram of a dual-slope ADC according to an embodiment of the invention.

FIG. 3a shows a block diagram of a dual-slope ADC according to an embodiment of the invention. In FIG. 3a, the dual-slope ADC comprises a buffer 302, an integrator 304, a comparison circuit 306, a resistance 308 and capacitances 310 and 312. The integrator 304, resistance 308 and capacitances 310 compose an integration circuit. The comparison circuit 306 is composed of a comparator 320 and a comparison unit 322. An integration voltage $V_{INT}$ (not shown in FIG. 1) is input into the dual-slope ADC through input terminals $IN_1$, and $IN_2$. The integration voltage $V_{INT}$ passes through the buffer 302 to the integrator 304 for a fixed amount of time to store charge in the capacitor 310, when the dual-slope ADC is fed with an opposite polarity voltage $V_{DINT}$ to effect de-integration. When the output voltage $V_{IO}$ of the integrator 304 returns to the initial point, called zero crossing, the comparator 320 changes its state and stops the de-integration process. The output of the comparator 320 is a pair of differential signals $S_1$, and $S_2$. The differential signals $S_1$ and $S_2$ are input to the comparison unit 322. The comparison unit 322 chooses a signal, whose voltage changes from a negative (low) voltage to a positive (high) voltage, from the differential signals $S_1$ and $S_2$ to produce an output signal. The comparison unit 322 outputs the output signal from the output terminal OUT.

Figure 3B:
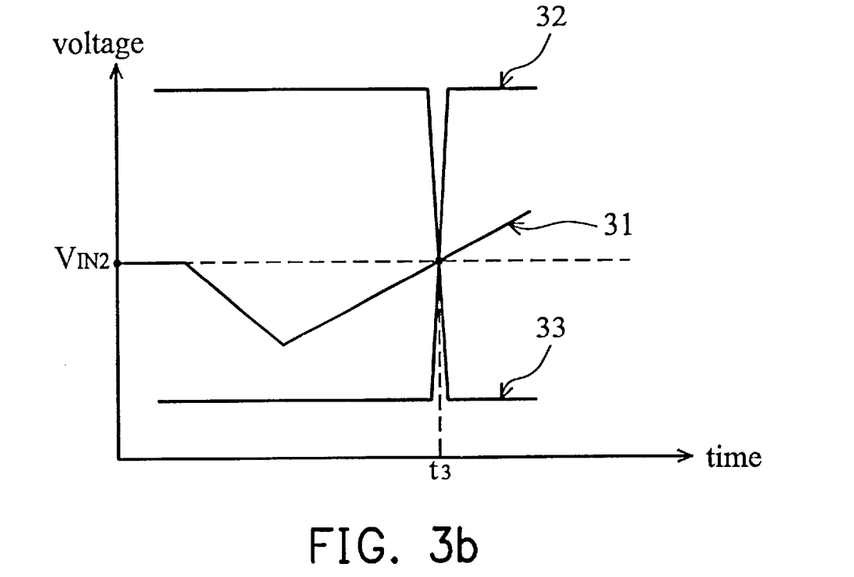
FIG. 3b shows the relation between the output voltage of the integrator and the output voltage of the compactor when the input voltage to the dual-slope ADC shown in FIG. 3a is positive.

FIG. 3b shows the relation between the output voltage of the integrator $V_{IO}$ and the output voltage of the compactor $V_{CMP+}$ and $V_{CMP-}$ when the input voltage to the dual-slope ADC shown in FIG. 3a is positive. In FIG. 3b, line 31 shows the relation between the output voltage of the integrator $V_{IO}$ and time. Line 32 shows the relation between the output voltage of the compactor $V_{CMP+}$ and time. Line 33 shows the relation between the output voltage of the compactor $V_{CMP-}$ and time. A voltage $V_{IN2}$ in the input terminal $IN_2$ is an initial voltage, i.e. the output voltage VIO equaling the voltage $V_{IN2}$ is called zero crossing. When the positive integration voltage $V_{INT}$ is input into the dual-slope ADC, i.e. the voltage input to the input terminal $IN_1$, is higher than the voltage input to the input terminal $IN_2$, while the output voltage $V_{IO}$ is equal to the voltage $V_{IN2}$ (referring to t3 in FIG. 3b), the output voltage of the integrator $V_{IO}$ changes from a negative (low) voltage to a positive (high) voltage and the output voltage of the compactor $V_{CMP+}$ is also from a negative (low) voltage to a positive (high) voltage. The output voltage of the compactor $V_{CMP-}$ changes from a positive (high) voltage to a negative (low) voltage. In the embodiment, the comparison unit 322 chooses a signal whose voltage changes from a negative (low) voltage to a positive (high) voltage, from the differential signals $S_1$ and $S_2$ to produce an output signal. Thus, the comparison unit 322 chooses the signal whose voltage is $V_{CMP+}$ to produce the output signal. Then, the comparison unit 322 outputs the output signal from the output terminal OUT.

Figure 3C:
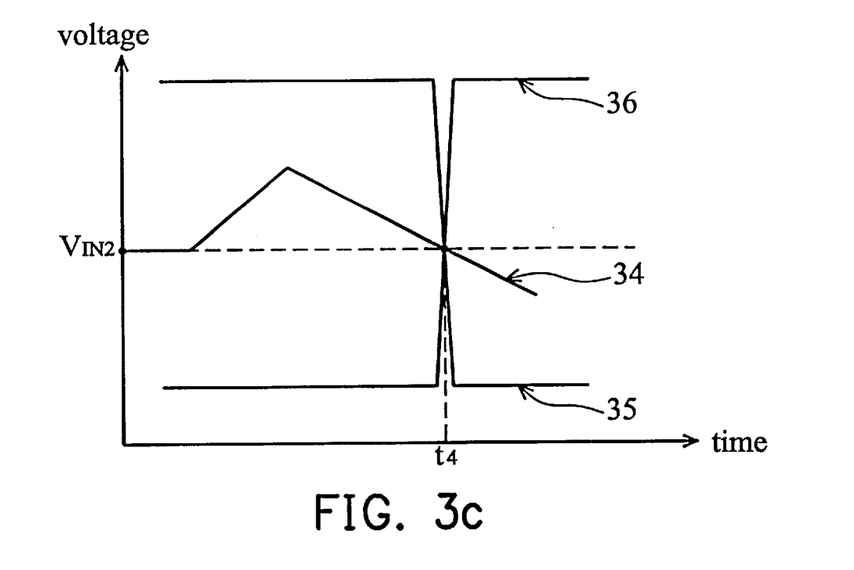
FIG. 3c shows the relation between the output voltage of the integrator and the output voltage of the compactor when the input voltage to the dual-slope ADC shown in FIG. 3a is negative.

FIG. 3c shows the relation between the output voltage of the integrator $V_{IO}$ and the output voltage of the compactor $V_{CMP+}$ and $V_{CMP-}$ when the input voltage to the dual-slope ADC shown in FIG. 3a is negative. In FIG. 3c, line 34 shows the relation between the output voltage of the integrator $V_{IO}$ and time. Line 35 shows the relation between the output voltage of the compactor $V_{CMP+}$ and time. Line 35 shows the relation between the output voltage of the compactor $V_{CMP-}$ and time. A voltage $V_{IN2}$ in the input terminal $IN_2$ is an initial voltage, i.e. the output voltage VIO equaling the voltage $V_{IN2}$ is called zero crossing. When the negative integration voltage $V_{INT}$ is input into the dual-slope ADC, i.e. the voltage input to the input terminal $IN_1$ is lower than the voltage input to the input terminal $IN_2$, while the output voltage $V_{IO}$ is equal to the voltage $V_{IN2}$ (referring to t4 in FIG. 3c), the output voltage of the integrator $V_{IO}$ changes from a positive (high) voltage to a negative (low) voltage and the output voltage of the compactor $V_{CMP+}$ is also from a positive (high) voltage to a negative (low) voltage. The output voltage of the compactor $V_{CMP-}$ changes from a negative (low) voltage to a positive (high) voltage. In the embodiment, the comparison unit 322 chooses a signal, whose voltage changes from a negative (low) voltage to a positive (high) voltage, from the differential signals $S_1$ and $S_2$ to produce an output signal. Thus, the comparison unit 322 chooses the signal whose voltage is $V_{CMP-}$ to produce the output signal. Then, the comparison unit 322 outputs the output signal from the output terminal OUT.

Figure 4:
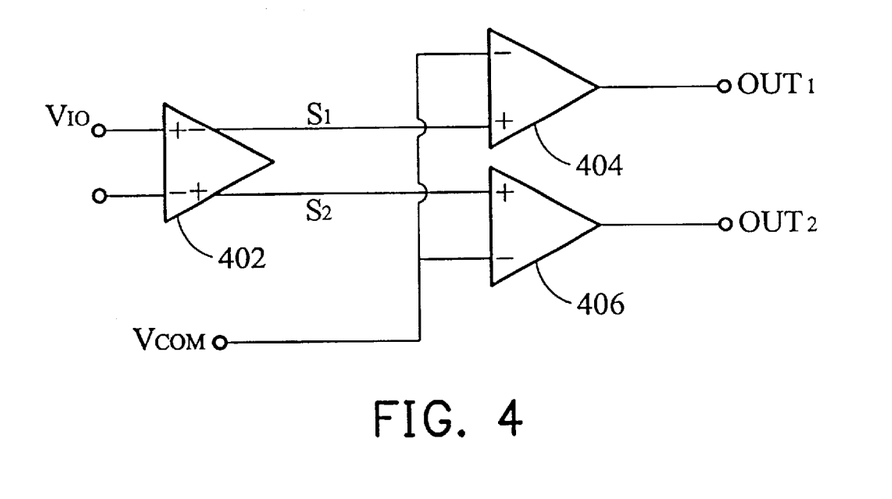

FIG. 4 shows a block diagram of an example of the comparison circuit according to the embodiment shown in FIG. 3a. The comparison circuit comprises a comparator 402 and a pair of single output comparators 404 and 406. The comparator 402 produces a pair of differential signals $S_1$ and $S_2$ to output. The voltage of the signal $S_1$ is $V_{CMP}$ (not shown in FIG. 4). The voltage of the signal $S_2$ is $V_{CMP+}$ (not shown in FIG. 4). The signal $S_1$ is input to the anode of the single output comparator 404. The signal $S_2$ is input to the anode of the single output comparator 406. The cathodes of single output comparators 404 and 406 are connected to ground or a common voltage of the circuit $V_{com}$. The following illustrates how the comparison circuit works.

Condition 1~when the positive integration voltage $V_{INT}$ is input into the dual-slope ADC, i.e. the voltage input to the input terminal $IN_1$ is higher than the voltage input to the input terminal $IN_2$:

while the output voltage $V_{IO}$ is equal to the voltage $V_{IN2}$ (referring to FIG. 3b), the output voltage of the integrator $V_{IO}$ changes from a negative (low) voltage to a positive (high) voltage and the output voltage of the compactor $V_{CMP+}$ is also from a negative (low) voltage to a positive (high) voltage. Thus, the output voltage of the single output comparator 406 from the output terminal OUT2 changes from a negative (low) voltage to a positive (high) voltage. A P-channel metal oxide semiconductor (PMOS) in the output stage of the single output comparator 406 (not shown in FIG. 4) changes from "OFF" to "ON" status and a N-channel metal oxide semiconductor (NMOS) in the output stage of the single output comparator 406 changes from "ON" to "OFF" status. At this time, the state of the single output comparator 406 is changed by the PMOS.

Condition 2~when the negative integration voltage $V_{INT}$ is input into the dual-slope ADC, i.e. the voltage input to the input terminal $IN_1$ is lower than the voltage input to the input terminal $IN_2$:

while the output voltage $V_{IO}$ is equal to the voltage $V_{IN2}$ (referring to FIG. 3c), the output voltage of the integrator $V_{IO}$ changes from a positive (high) voltage to a negative (low) voltage but the output voltage of the compactor $V_{CMP-}$ changes from a negative (low) voltage to a positive (high) voltage. Thus, the output voltage of the single output comparator 404 from the output terminal OUT1 changes from a negative (low) voltage to a positive (high) voltage. A P-channel metal oxide semiconductor (PMOS) in the output stage of the single output comparator 404 (not shown in FIG. 4) changes from "OFF" to "ON" status and a N-channel metal oxide semiconductor (NMOS) in the output stage of the single output comparator 404 changes from "ON" to "OFF" status. At this time, the state of the single output comparator 404 is changed by the PMOS.

When calculating the measured result of the dual-slope ADC, under condition 1, the change of the output terminal OUT2 of the single output comparator 406 is detected and, under condition 2, the change of the output terminal OUT1 of the single output comparator 404 is detected.

While the output voltage $V_{IO}$ is equal to the voltage $V_{IN2}$, the difference of the time of the output terminal OUT2 of the single output comparator 406 from the a negative (low) voltage to a positive (high) voltage under condition 1 and the time of the output terminal OUT1 of the single output comparator 404 from the a negative (low) voltage to a positive (high) voltage under condition 2 is smaller than the measured result of the conventional dual-slope ADC. Thus, using the comparison circuit in the embodiment of the invention can reduce rollover errors influenced by the comparator. It also can reduce rollover errors due to various input signals in various conditions influenced by different procedures and environments. For different procedures and environments that can influence rollover error, Table A illustrates the measured results of the conventional dual-slope ADC according to FIG. 1 and Table B illustrates the measured results of the dual-slope ADC according to the invention. Change in the voltage input of the comparator of +15 $\mu$v or −15 $\mu$V every 1us are assumed. It is also assumed that the period of the clock (count) signal to measure the measured result is 2 $\mu$s. In Tables A and B, the first column lists procedures and environments. The second column lists the delay when the positive integration voltage $V_{INT}$ is input into the dual-slope ADC i.e. under condition 1. The third column of the table is the delay when the negative integration voltage $V_{INT}$ is input into the dual-slope ADC i.e. under condition 2. The fourth column of the table is the difference between the value of the second column and the value of the third column in the same row i.e. rollover errors. After comparing the tables, rollover errors caused by the dual-slope ADC of the invention are smaller than those caused by the conventional dual-slope ADC. Furthermore, for different procedures and environments, rollover errors caused by the dual-slope ADC of the invention are almost the same (referring to the fourth column in Table B)

TABLE A

| Conditions | Delay ($\mu$s) | Delay ($\mu$s) | Roll-over error |
|---|---|---|---|
| TT, 3.3 V, 25° C. | 3.4 | 2.9 | 0.5 $\mu$s/0.25 counts |
| FF, 3.3 V, 25° C. | 4.3 | 2.5 | 1.8 $\mu$s/0.90 counts |
| FS, 3.3 V, 25° C. | 2.3 | 4.0 | 1.7 $\mu$s/0.85 counts |
| SS, 3.3 V, 25° C. | 2.5 | 3.2 | 0.7 $\mu$s/0.35 counts |
| SF, 3.3 V, 25° C. | 4.5 | 1.7 | 2.8 $\mu$s/1.40 counts |
| TT, 3.0 V, 25° C. | 1.2 | 5.0 | 3.8 $\mu$s/1.90 counts |
| TT, 3.6 V, 25° C. | 5.5 | 0.7 | 4.8 $\mu$s/2.40 counts |
| TT, 3.3 V, −10° C. | 2.8 | 2.6 | 0.2 $\mu$s/0.10 counts |
| TT, 3.3 V, 125° C. | 5.3 | 3.5 | 1.8 $\mu$s/0.90 counts |

TABLE B

| Conditions | Delay ($\mu$s) | Delay ($\mu$s) | Roll-over error |
|---|---|---|---|
| TT, 3.3 V, 25° C. | 5.87 | 5.98 | 0.11 $\mu$s/0.06 counts |
| FF, 3.3 V, 25° C. | 6.13 | 6.25 | 0.12 $\mu$s/0.06 counts |
| FS, 3.3 V, 25° C. | 5.89 | 6.00 | 0.11 $\mu$s/0.06 counts |
| SS, 3.3 V, 25° C. | 5.60 | 5.72 | 0.12 $\mu$s/0.06 counts |
| SF, 3.3 V, 25° C. | 5.84 | 5.96 | 0.12 $\mu$s/0.06 counts |
| TT, 3.0 V, 25° C. | 5.80 | 5.91 | 0.11 $\mu$s/0.06 counts |
| TT, 3.6 V, 25° C. | 5.93 | 6.05 | 0.12 $\mu$s/0.06 counts |
| TT, 3.3 V, −10° C. | 5.43 | 5.54 | 0.11 $\mu$s/0.06 counts |
| TT, 3.3 V, 125° C. | 7.18 | 7.31 | 0.13 $\mu$s/0.07 counts |

In the above embodiment, the comparison unit chooses the signal, whose voltage changes from a negative (low) voltage to a positive (high) voltage, from the differential signals to produce the output signal, so, when calculating the measured result of the dual-slope ADC, under condition 1, the change of the output terminal OUT2 of the single output comparator 406 must be detected and, under condition 2, the change of the output terminal OUT1 of the single output comparator 404 must be detected. In another embodiment, the comparison unit can choose a signal, whose voltage changes from a positive (high) voltage to a negative (low) voltage, from the differential signals to produce an output signal. In this situation, when calculating the measured result of the dual-slope ADC, under condition 1, the change of the output terminal OUT1 of the single output comparator 404 must be detected and, under condition 1, the change in the output terminal OUT2 of the single output comparator 406 must be detected.

Figure 5:
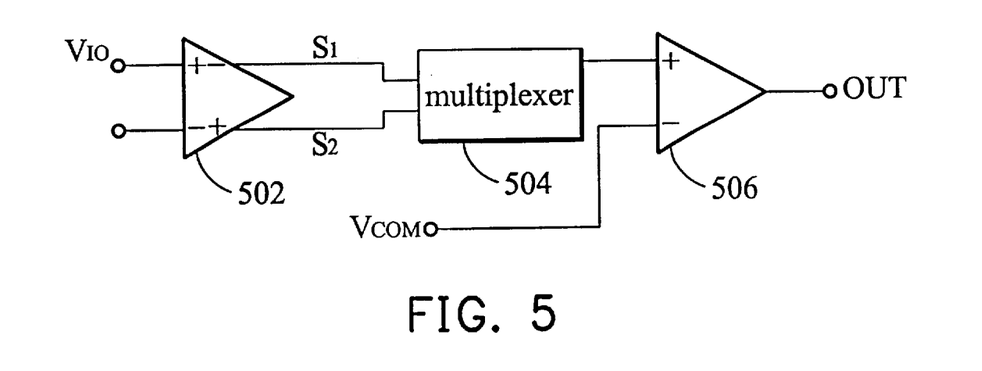

FIG. 5 shows a block diagram of another example of the comparison circuit according to the embodiment shown in FIG. 3a. The comparison circuit comprises a comparator 502, a multiplexer 504 and a single output comparator 506. The comparator 502 produces a pair of differential signals $S_1$ and $S_2$ to output. The voltage of the signal $S_1$ is $V_{CMP-}$ (not shown in FIG. 5). The voltage of the signal $S_2$ is $V_{CMP+}$ (not shown in FIG. 5). The multiplexer 504 receives the differential signals and chooses a signal whose voltage changes from a negative (low) voltage to a positive (high) voltage from the differential signals $S_1$ and $S_2$. The single output comparator 506 receives the signal whose voltage changes from a negative (low) voltage to a positive (high) voltage to produce an output signal. The single output comparator 506 outputs the output signal from the output terminal OUT. The following illustrates how the comparison circuit works.

Condition 1~when the positive integration voltage $V_{INT}$ is input into the dual-slope ADC, i.e. the voltage input to the input terminal $IN_1$ is higher than the voltage input to the input terminal $IN_2$:

While the output voltage $V_{IO}$ is equal to the voltage $V_{IN2}$ (referring to FIG. 3b), the output voltage of the integrator $V_{IO}$ changes from a negative (low) voltage to a positive (high) voltage and the output voltage of the compactor $V_{CMP+}$ is also from a negative (low) voltage to a positive (high) voltage. At this time, the multiplexer 504 inputs the signal $S_2$ whose voltage changes from a negative (low) voltage to a positive (high) voltage to the single output comparator 506. Thus, the output voltage of the single output comparator 506 from the output terminal OUT changes from a negative (low) voltage to a positive (high) voltage. A P-channel metal oxide semiconductor (PMOS) in the output stage of the single output comparator 506 (not shown in FIG. 5) changes from "OFF" to "ON" status and a N-channel metal oxide semiconductor (NMOS) in the output stage of the single output comparator 506 changes from "ON" to "OFF" status. At this time, the state of the single output comparator 506 is changed by the PMOS.

Condition 2~when the negative integration voltage $V_{INT}$ is input into the dual-slope ADC, i.e. the voltage input to the input terminal $IN_1$ is lower than the voltage input to the input terminal $IN_2$:

While the output voltage $V_{IO}$ is equal to the voltage $V_{IN2}$ (referring to FIG. 3c), the output voltage of the integrator $V_{IO}$ changes from a positive (high) voltage to a negative (low) voltage but the output voltage of the compactor $V_{CMP-}$ changes from a negative (low) voltage to a positive (high) voltage. At that time, the multiplexer 504 inputs the signal $S_1$ whose voltage changes from a negative (low) voltage to a positive (high) voltage to the single output comparator 506. Thus, the output voltage of the single output comparator 506 from the output terminal OUT changes from a negative (low) voltage to a positive (high) voltage. A P-channel metal oxide semiconductor (PMOS) in the output stage of the single output comparator 506 (not shown in FIG. 5) changes from "OFF" to "ON" status and a N-channel metal oxide semiconductor (NMOS) in the output stage of the single output comparator 506 changes from "ON" to "OFF" status. At this time, the state of the single output comparator 506 is changed by the PMOS.

While the output voltage $V_{IO}$ is equal to the voltage $V_{IN2}$, the difference in the time of the output terminal OUT of the single output comparator 506 from the a negative (low) voltage to a positive (high) voltage under condition 1 and the time of the output terminal OUT1 of the single output comparator 506 from the a negative (low) voltage to a positive (high) voltage under condition 2 is smaller than the measured result of the conventional dual-slope ADC. Thus, the comparison circuit in the embodiment of the invention can reduce rollover errors influenced by the comparator. It also can reduce rollover errors due to various input signals in various conditions influenced by different procedures and environments.

In the above embodiment, the comparison unit chooses the signal, whose voltage changes from a negative (low) voltage to a positive (high) voltage, from the differential signals to produce the output signal, so, under condition 1, the multiplexer inputs the signal $S_2$ whose voltage changes from a negative (low) voltage to a positive (high) voltage to the single output comparator to produce the output signal and, under condition 2, the multiplexer inputs the signal $S_1$ whose voltage changes from a negative (low) voltage to a positive (high) voltage to the single output comparator to produce the output signal. In other embodiment, the comparison unit can choose a signal, whose voltage changes from a positive (high) voltage to a negative (low) voltage, from the differential signals to produce-an output signal. In this situation, under condition 1, the multiplexer inputs the signal $S_1$ whose voltage changes from a positive (high) voltage to a negative (low) voltage to the single output comparator to produce the output signal and, under condition 2, the multiplexer inputs the signal $S_2$ whose voltage changes from a positive (high) voltage to a negative (low) voltage to the single output comparator to produce the output signal.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Thus, the scope of the appended claims should be accorded the broadest interpretation so as to encompass all such modifications and similar arrangements.

What is claimed is:

1. A dual-slope analog-to-digital converter, comprising:
    a buffer;
    an integrator coupled to the buffer; and
    a comparison circuit comprising:
        a differential output comparator coupled to the integrator and producing a pair of differential signals to output; and
        a comparison unit for receiving the differential signals and choosing a signal, whose voltage is from a first level to a second level, from the differential signals to produce an output signal.

2. The dual-slope analog-to-digital converter as claimed in claim 1, wherein the comparison unit comprises:
    a multiplexer for receiving the differential signals and choosing the signal whose voltage changes from the first level to the second level from the differential signals; and
    a single output comparator for receiving the signal whose voltage changes from the first level to the second level to produce the output signal.

3. The dual-slope analog-to-digital converter as claimed in claim 1, wherein the comparison unit comprises:
    a pair of single output comparators, each receiving one of the differential signals to choose the signal whose voltage changes from the first level to the second level from the differential signal, with the single output comparator that receives the signal whose voltage changes from the first level to the second level producing the output signal.

4. The dual-slope analog-to-digital converter as claimed in claim 1, wherein the first level is positive and the second level is negative.

5. The dual-slope analog-to-digital converter as claimed in claim 1, wherein the first level is negative and the second level is positive.

6. A comparison circuit for a dual-slope analog-to-digital converter, comprising a buffer and an integrator coupled to the buffer, the comparison circuit comprising:
- a differential output comparator coupled to the integrator and producing a pair of differential signals to output; and
- a pair of single output comparators, each of them receiving one of the differential signals to choose a signal whose voltage is from a first level to a second level from the differential signal, with the single output comparator that receives the signal whose voltage changes from the first level to the second level producing an output signal.

7. The comparison circuit as claimed in claim 6, wherein the first level is positive and the second level is negative.

8. The comparison circuit as claimed in claim 5, wherein the first level is negative and the second level is positive.

9. A comparison circuit for a dual-slope analog-to-digital converter, comprising a buffer and an integrator coupled to the buffer, the comparison circuit comprising:
- a differential output comparator coupled to the integrator and producing a pair of differential signals to output;
- a multiplexer for receiving the differential signals and choosing a signal whose voltage is from a first level to a second level from the differential signals; and
- a single output comparator for receiving the signal whose voltage changes from the first level to the second level to produce an output signal.

10. The comparison circuit as claimed in claim 9, wherein the first level is positive and the second level is negative.

11. The comparison circuit as claimed in claim 9, wherein the first level is negative and the second level is positive.

* * * * *